United States Patent
Li et al.

(10) Patent No.: US 10,139,872 B1
(45) Date of Patent: Nov. 27, 2018

(54) MOTHERBOARD ASSEMBLY AND RETAINER THEREOF

(71) Applicants: INVENTEC (PUDONG) TECHNOLOGY CORPORATION, Shanghai (CN); INVENTEC CORPORATION, Taipei (TW)

(72) Inventors: Hsueh-Chan Li, Taipei (TW); Wei-Han Hsueh, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/867,537

(22) Filed: Jan. 10, 2018

(30) Foreign Application Priority Data

Nov. 23, 2017 (CN) .......................... 2017 1 1179310

(51) Int. Cl.
    *H05K 7/14* (2006.01)
    *H05K 7/18* (2006.01)
    *G06F 1/18* (2006.01)

(52) U.S. Cl.
    CPC ........... *G06F 1/185* (2013.01); *H05K 7/1429* (2013.01)

(58) Field of Classification Search
    CPC ....... H05K 7/1429; G06F 1/185; G06F 1/181; G06F 1/182

USPC ................................................. 361/801–802
See application file for complete search history.

(56) References Cited

U.S. PATENT DOCUMENTS

| | | | |
|---|---|---|---|
| 6,625,041 B1 * | 9/2003 | Chen .................... | H05K 5/0286 24/293 |
| 7,077,678 B1 * | 7/2006 | Korsunsky ......... | H01R 12/7005 439/326 |

* cited by examiner

*Primary Examiner* — Hung S Bui
(74) *Attorney, Agent, or Firm* — Maschoff Brennan

(57) ABSTRACT

The disclosure is related to a motherboard assembly including a circuit board, an expansion port and at least one retainer. The expansion port is disposed on the circuit board. The retainer includes a supporting portion disposed on the circuit board, an elastic portion movably connected to the supporting portion, a holding portion protruding from the elastic portion, an extension portion connected to the elastic portion and a pressing member connected to the supporting portion. The pressing member and the extension portion is located at a same side of the supporting portion. A portion of the pressing portion is located at a side of the extension portion away from the circuit board. An orthogonal projection of the pressing member on the circuit board partially overlaps an orthogonal projection of the extension portion on the circuit board. In addition, the disclosure is also related to a retainer.

7 Claims, 6 Drawing Sheets

MOTHERBOARD ASSEMBLY AND RETAINER THEREOF

CROSS-REFERENCE TO RELATED APPLICATIONS

This non-provisional application claims priority under 35 U.S.C. § 119(a) on Patent Application No(s). 201711179310.4 filed in China on Nov. 23, 2017, the entire contents of which are hereby incorporated by reference.

BACKGROUND OF THE INVENTION

Technical Field of the Invention

The disclosure relates to an assembly, more particularly to a motherboard assembly for the installation of an expansion card and a retainer thereof.

Description of the Related Art

In a computer, there are not only essential components, such as CPU and power supply, but also one or more expansion slots for the insertion of expansion card to give extra facilities or memory. The expansion card is, for example, an interface card, a modem or a network card.

SUMMARY

One embodiment of the disclosure provides a motherboard assembly, for the installation of an expansion card, including a circuit board, an expansion port and at least one retainer. The expansion port is disposed on the circuit board, for the insertion of the expansion card. The retainer includes a supporting portion, an elastic portion, a holding portion, an extension portion and a pressing member. The supporting portion is disposed on the circuit board. The elastic portion is movably connected to a side of the supporting portion away from the expansion port. The holding portion protrudes from the elastic portion and is located opposite to the supporting portion, for holding the expansion card. The extension portion is connected to the elastic portion and is located opposite to the supporting portion. The pressing member is connected to the supporting portion. The pressing member and the extension portion is located at a same side of the supporting portion. A portion of the pressing portion is located at a side of the extension portion away from the circuit board. An orthogonal projection of the pressing member on the circuit board partially overlaps an orthogonal projection of the extension portion on the circuit board.

One embodiment of the disclosure provides a retainer adapted to be disposed on a circuit board. The retainer includes a supporting portion, an elastic portion, a holding portion, an extension portion, and a pressing member. The supporting portion is disposed on the circuit board. The elastic portion is movably connected to the supporting portion. The holding portion, for holding the expansion card, protrudes from the elastic portion. The extension portion is connected to a side of the elastic portion not connected to the supporting portion. The pressing member is connected to the supporting portion. The pressing portion is located at a side of the extension portion away from the circuit board. An orthogonal projection of the pressing member on the circuit board partially overlaps an orthogonal projection of the extension portion on the circuit board.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
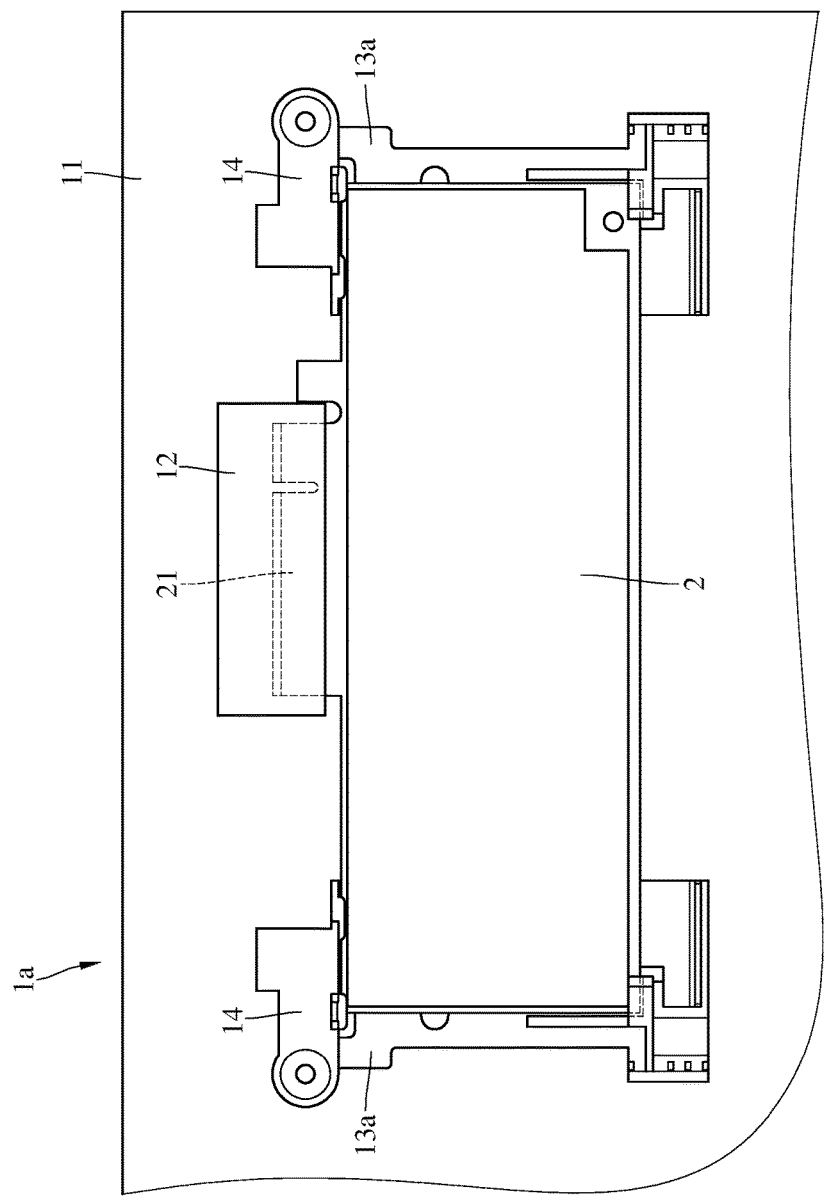
FIG. 1 is a partial top view of a motherboard assembly according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
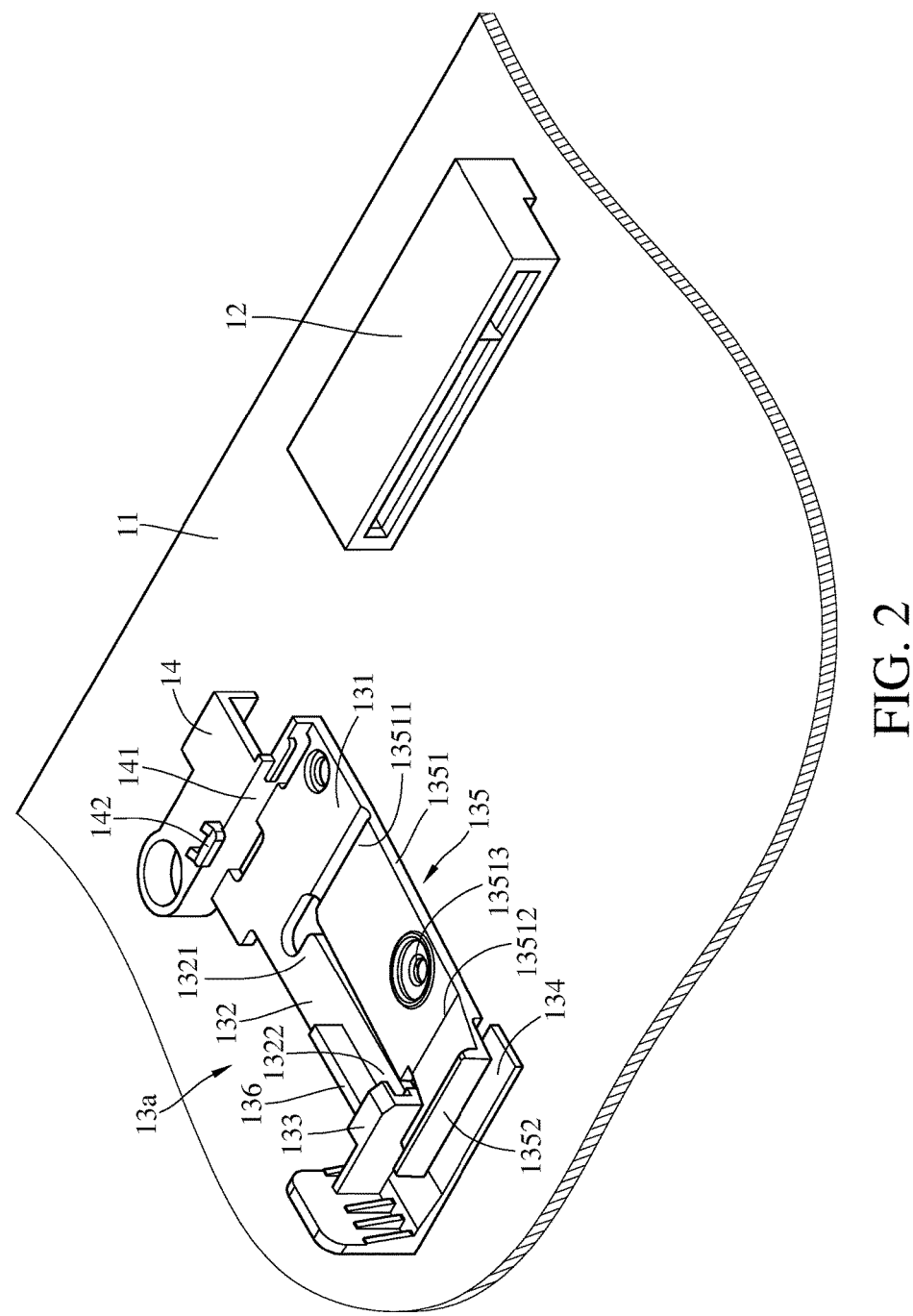
FIG. 2 is a partial perspective view of the motherboard assembly in FIG. 1.

Please refer to FIGS. 1-2, FIG. 1 is a partial top view of a motherboard assembly according to a first embodiment of the present disclosure, and FIG. 2 is a partial perspective view of the motherboard assembly in FIG. 1.

This embodiment provides a motherboard assembly 1a which is adapted for an expansion card 2 having a connector 21 to be installed thereto. The motherboard assembly 1a includes a circuit board 11, an expansion port 12, two retainers 13a and two positioning members 14.

The two retainers 13a are respectively located at two opposite sides of the expansion card 2 for holding the expansion card 2 in position. In detail, each retainer 13a includes a supporting portion 131, an elastic portion 132, a holding portion 133, an extension portion 134, a pressing member 135 and a side wall portion 136.

The supporting portion 131 is disposed on the circuit board 11. The elastic portion 132 has a first end 1321 and a second end 1322 opposite to each other. The elastic portion 132 is movable connected to a side of the supporting portion 131 away from the expansion port 12 with the first end 1321. The holding portion 133 is located opposite to the supporting portion 131. The extension portion 134 protrudes from the second end 1322 of the elastic portion 132 and is also located opposite to the supporting portion 131.

The pressing member 135 includes a movable portion 1351 and a pressing portion 1352. The movable portion 1351 has a first end 13511, a second end 13512 and an assembly hole 13513. The first end 13511 and the second end 13512 are located opposite to each other, and the assembly hole 13513 is located between the first end 13511 and the second end 13512. The movable portion 1351 is movable connected to the supporting portion 131 with the first end 13511, and is connected to the pressing portion 1352 with the second end 13512. The pressing member 135 and the extension portion 134 are located at a same side of the supporting portion 131. The pressing portion 1352 is located at a side of the extension portion 134 away from the circuit board 11, and an orthogonal projection of the pressing portion 1352 on the circuit board 11 partially overlaps an orthogonal projection of the extension portion 134 on the circuit board 11.

In this embodiment, the movable portion 1351 of the pressing member 135 is movable with respect to the supporting portion 131. Normally (e.g. no pressure is applied on the movable portion 1351), the movable portion 1351 is upturned with respect to the supporting portion 131, and that is beneficial to simplify the process of mold releasing of the retainer 13a. However, the movable portion 1351 is optional; in some other embodiments, the pressing member may have no movable portion.

The side wall portion 136 protrudes from the elastic portion 132 and extends along a direction from the second end 1322 towards the first end 1321. In other words, the side wall portion 136 extends along a direction from the holding portion 133 towards the supporting portion 131.

The positioning member 14 is disposed on the circuit board 11, and has a retaining wall 141 and a protrusion 142. The retaining wall 141 is connected to a side of the supporting portion 131 away from the elastic portion 132. The protrusion 142 protrudes from the retaining wall 141 towards the elastic portion 132, and is located opposite to the holding portion 133.

Figure 3:
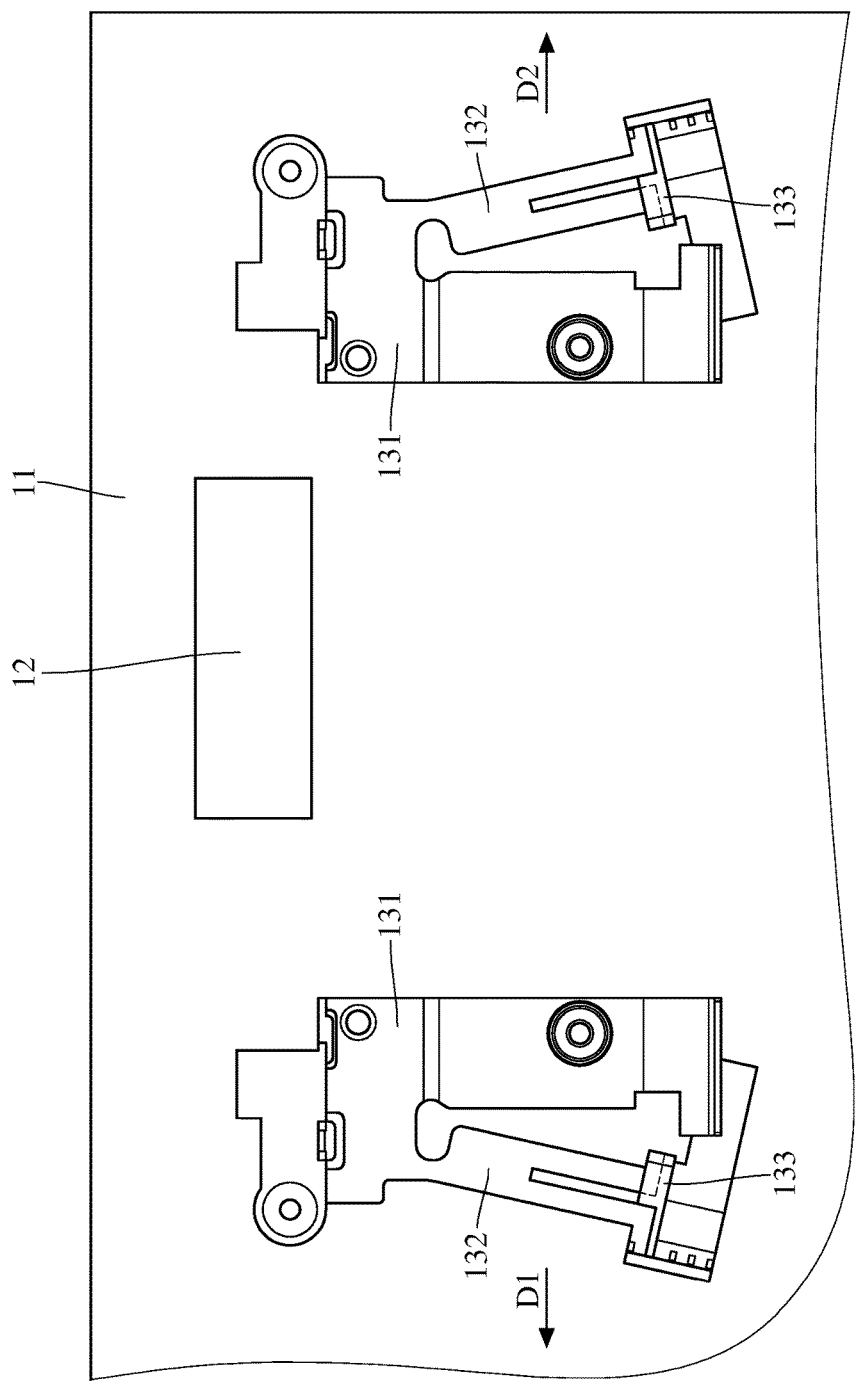
FIGS. 3-5 shows the operation of the motherboard assembly in FIG. 1.
Figure 4:
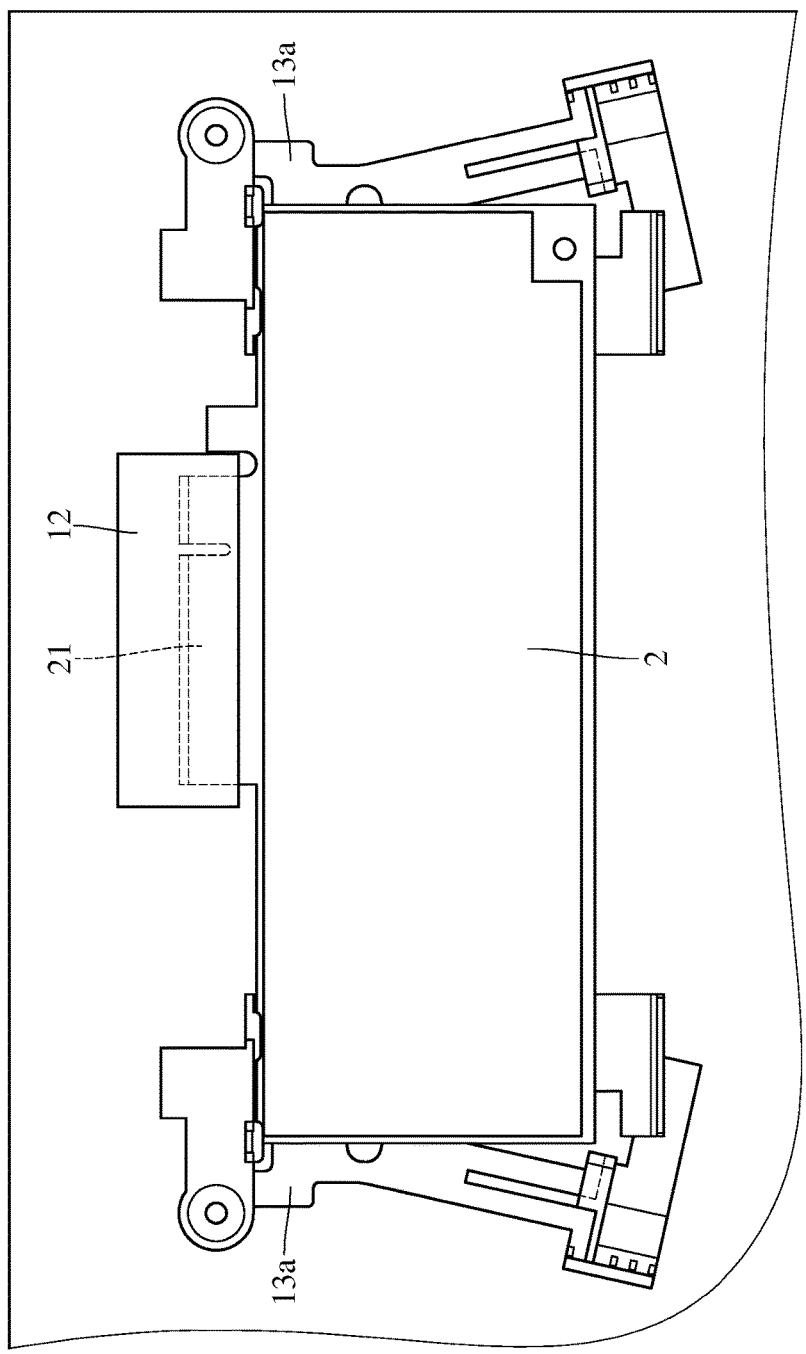
Figure 5:
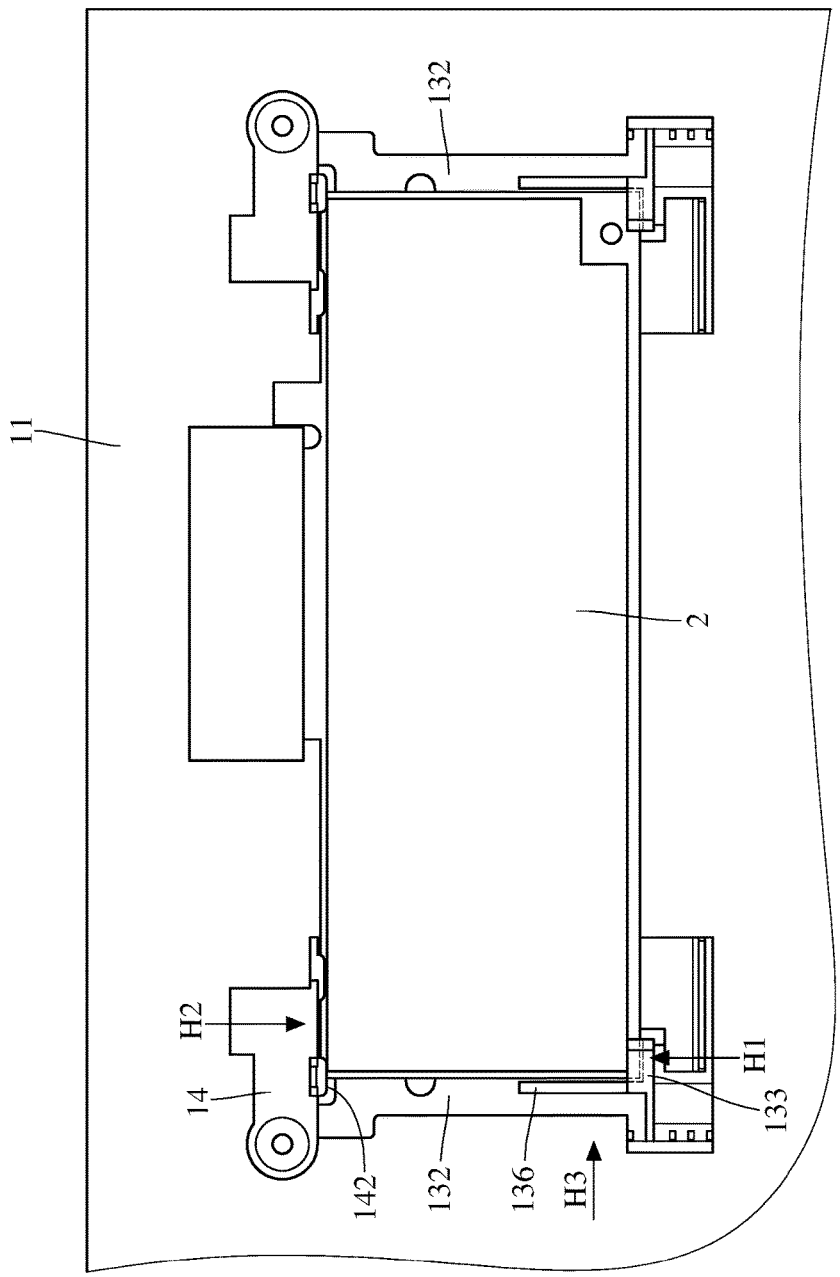

Then, please refer to FIGS. 3-5, which shows the operation of the motherboard assembly in FIG. 1. Firstly, as shown in FIG. 3, the two elastic portions 132 are bent outward with respect to the supporting portions 131, respectively along releasing directions D1 and D2, such that the holding portions 133 are moved outward to create an opening for the insertion of the expansion card 2. Then, as shown in FIG. 4, the expansion card 2 is inserted into the expansion port 12 with the connector 21, and the expansion card 2 is pushed toward the circuit board 11 and located between the two retainers 13a. Then, as shown in FIG. 5, releasing the elastic portions 132 to return them to original positions, such that the holding portions 133 hold and clamp the expansion card 2, finishing the installation of the expansion card 2.

When the expansion card 2 is held in position by the retainers 13a, each of the left side and right side of the expansion card 2 is prevented from moving in four directions. In detail, the holding portion 133 presses against a side of the expansion card 2 away from the expansion port 12 and another side away from the circuit board 11, such that the expansion card 2 is prevented from moving in two directions (e.g. a first horizontal direction H1 and vertical direction) by the holding portion 133. In addition, the retaining wall 141 presses against a side of the expansion card 2 facing the expansion port 12 so as to prevent the expansion card 2 from moving in a second horizontal direction H2. Furthermore, the protrusion 142 presses against a side of the expansion card 2 away from the circuit board 11 so as to prevent the expansion card 2 from moving in the vertical direction. By the limitation of the holding portion 133 and the protrusion 142, the expansion card 2 is prevented from moving away from the circuit board 11. The side wall portion 136 presses against a side of the expansion card 2 opposite to another retainer 13a, such that the side wall portions 136 are able to prevent the expansion card 2 from moving in a third horizontal direction H3. It is understood that the first horizontal direction H1 is opposite to the second horizontal direction H2 and is perpendicular to the third horizontal direction H3.

In addition, in this embodiment, the movable portion 1351 is moved toward the circuit board 11 by being pressed by the expansion card 2 so as to bring the pressing portion 1352 to press against the extension portion 134, thereby preventing the extension portion 134 from moving in vertical direction. In such a case, when the motherboard assembly 1a is being hit, moved or shaken, the elastic portion 132 is prevented from moving with respect to the circuit board 11. As a result, the holding portions 133 are prevented from detaching form the expansion card 2. However, the way to fix the movable portion 135 is not restricted. Alternatively, the movable portion 135 may be fixed to a lock hole (not shown) on the circuit board 11 by screwing a fastener through the assembly hole 13513.

Figure 6:
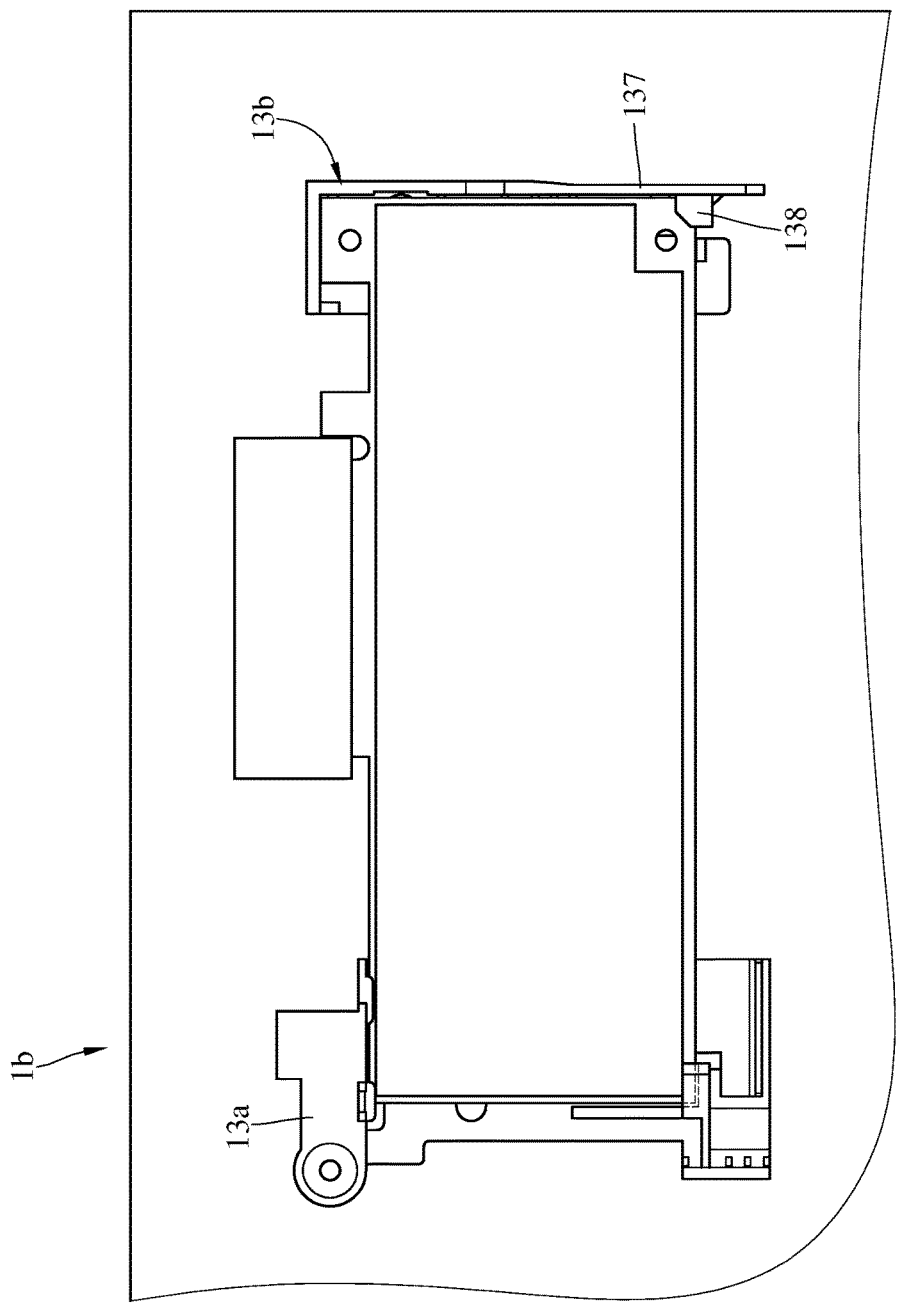
FIG. 6 is a partial top view of a motherboard assembly according to a second embodiment of the present disclosure.

Furthermore, it is noted that the motherboard assembly may have different types of retainers, please refer to FIG. 6, which is a partial top view of a motherboard assembly according to a second embodiment of the present disclosure. This embodiment provides a motherboard assembly 1b having two retainers, one of them, i.e. the retainer 13a, is the same as that in the previous embodiment, and the other is a retainer 13b. The retainer 13b includes an elastic arm 137 and a latch 138. The latch 138 can latch to or detach from the expansion card 2 by deforming the elastic arm 137.

According to the motherboard assembly and the retainer as discussed above, the extension portion is located between the pressing portion of the pressing member and the circuit board, and the orthogonal projection of the pressing portion on the circuit board partially overlaps the orthogonal projection of the extension portion on the circuit board, so when the retainer holds the expansion card in position to make the expansion card pressing against the movable portion of the pressing member, the extension portion is pressed by the pressing portion and is restricted between the pressing portion and the circuit board. As a result, the elastic portion is prevented from moving in vertical direction, so when the motherboard assembly is being hit, moved or shaken, the elastic portion is prevented from moving with respect to the circuit board, thereby increasing the holding strength of the retainer to the expansion card.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A motherboard assembly, adapted for an expansion card to be installed thereto, comprising:
   a circuit board;
   an expansion port, disposed on the circuit board, for the insertion of the expansion card; and
   at least one retainer, comprising:
      a supporting portion, disposed on the circuit board;
      an elastic portion, movably connected to a side of the supporting portion away from the expansion port;
      a holding portion, protruding from the elastic portion and located opposite to the supporting portion in order to hold the expansion card;
      an extension portion, connected to the elastic portion and located opposite to the supporting portion; and
      a pressing member, connected to the supporting portion, the pressing member and the extension portion located at a same side of the supporting portion, the pressing member comprising a movable portion and a pressing portion, a portion of the pressing portion located at a side of the extension portion away from the circuit board, one end of the movable portion movably connected to the supporting portion, another end of the movable portion connected to the pressing portion so that the pressing portion is movably connected to the supporting portion, wherein an orthogonal projection of the pressing member on the circuit board partially overlaps an orthogonal projection of the extension portion on the circuit board.

2. The motherboard assembly according to claim 1, wherein an orthogonal projection of the pressing portion on the circuit board partially overlaps the orthogonal projection of the extension portion on the circuit board.

3. The motherboard assembly according to claim 2, wherein the movable portion has an assembly hole corresponding to a lock hole on the circuit board.

4. The motherboard assembly according to claim 1, wherein the at least one retainer comprises a side wall portion, the side wall portion protrudes from the elastic portion and extends along a direction from the holding portion toward the supporting portion.

5. The motherboard assembly according to claim 1, further comprising a positioning member, the positioning member having a retaining wall and a protrusion, the retaining wall connected to a side of the supporting portion away from the elastic portion, and the protrusion disposed on a side of the retaining wall facing the elastic portion.

6. The motherboard assembly according to claim 1, wherein the quantity of the at least one retainer is two, the two retainers respectively for holding two opposite sides of the expansion card.

7. A retainer, adapted to be disposed on a circuit board, comprising:

a supporting portion, disposed on the circuit board;

an elastic portion, movably connected to the supporting portion;

a holding portion, protruding from the elastic portion, for holding an expansion card;

an extension portion, connected to a side of the elastic portion not connected to the supporting portion; and a pressing member, connected to the supporting portion, the pressing member comprising a movable portion and a pressing portion, the pressing portion located at a side of the extension portion away from the circuit board, one end of the movable portion movably connected to the supporting portion, another end of the movable portion connected to the pressing portion so that the pressing portion is movably connected to the supporting portion, wherein an orthogonal projection of the pressing member on the circuit board partially overlaps an orthogonal projection of the extension portion on the circuit board.

* * * * *